United States Patent
Suzuki (10) Patent No.: US 11,646,334 B2
(45) Date of Patent: May 9, 2023

(54) SEMICONDUCTOR DEVICE, MANUFACTURING METHOD FOR SAME, AND EQUIPMENT

(71) Applicant: CANON KABUSHIKI KAISHA, Tokyo (JP)

(72) Inventor: Takayuki Suzuki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 137 days.

(21) Appl. No.: 17/189,477

(22) Filed: Mar. 2, 2021

(65) Prior Publication Data
US 2021/0288093 A1    Sep. 16, 2021

(30) Foreign Application Priority Data
Mar. 10, 2020  (JP) .............................. JP2020-041217

(51) Int. Cl.
*H01L 27/146*     (2006.01)
(52) U.S. Cl.
CPC .... *H01L 27/14623* (2013.01); *H01L 27/1464* (2013.01); *H01L 27/14685* (2013.01); *H01L 27/14627* (2013.01)
(58) Field of Classification Search
CPC ......... H01L 27/14612; H01L 27/14621; H01L 27/14623; H01L 27/14627; H01L 27/14629; H01L 27/1464; H01L 27/14685
See application file for complete search history.

(56) References Cited

U.S. PATENT DOCUMENTS

| | | | |
|---|---|---|---|
| 2009/0014823 A1 | 1/2009 | Kokusenya | |
| 2017/0338265 A1* | 11/2017 | Yoshiba | H01L 27/14621 |
| 2019/0157330 A1 | 5/2019 | Sato et al. | |
| 2019/0252439 A1* | 8/2019 | Ogawa | H01L 31/02164 |
| 2020/0027913 A1* | 1/2020 | Nomura | H01L 27/14629 |
| 2020/0243589 A1 | 7/2020 | Yoshiba et al. | |
| 2021/0313381 A1* | 10/2021 | Murata | H01L 27/14638 |
| 2021/0366964 A1* | 11/2021 | Ito | H01L 27/14623 |
| 2022/0068991 A1* | 3/2022 | Tanaka | H01L 27/14623 |
| 2022/0223642 A1* | 7/2022 | Hoshi | H01L 27/1463 |

FOREIGN PATENT DOCUMENTS

| | | |
|---|---|---|
| JP | 2009-021415 A | 1/2009 |
| WO | 2016/114154 A1 | 7/2016 |
| WO | 2018/008614 A1 | 1/2018 |

* cited by examiner

*Primary Examiner* — Nelson Garces
(74) *Attorney, Agent, or Firm* — Venable LLP (57) ABSTRACT

A semiconductor device includes a semiconductor layer, a metal layer disposed above a surface of the semiconductor layer, a first barrier portion that covers a first portion of a surface of the metal layer, a second barrier portion that covers a second portion of the surface of the metal layer, an insulating film that covers the metal layer and the first and second barrier portions; and a metal member that is disposed in an opening portion provided in the insulating film, the metal member positioned on a third portion of the surface of the metal layer that is between the first portion and the second portion. A part of the insulating film is disposed between the metal member and the first barrier portion and between the metal member and the second barrier portion.

20 Claims, 9 Drawing Sheets

SEMICONDUCTOR DEVICE, MANUFACTURING METHOD FOR SAME, AND EQUIPMENT

BACKGROUND OF THE INVENTION

Field of the Invention

The present invention relates to a semiconductor device, a manufacturing method for the semiconductor device, and equipment.

Description of the Related Art

A semiconductor device, e.g., a photoelectric conversion device, can usually have a light-shielded pixel area (optical black area (OPB area)) in addition to a light-receiving pixel area (effective pixel area). A light-shielded pixel disposed in the light-shielded pixel area is shielded from light by a light-shielding film, and can be used to detect an optical black level (black level). International Publication No. 2016/114154 discloses an image sensor that includes light-shielding films and light-shielding walls.

There are cases in which a barrier film is disposed on a metal surface when forming a light-shielding wall using a metal. As a method for forming the light-shielding wall in such a case, there is a method in which, after an insulating film is formed on a surface of a light-shielding film, and an opening is formed in the insulating film by dry etching, a photoresist is removed by ashing, and a metal is buried in the opening. During such a process, a partial loss of the barrier film disposed on the surface of the light-shielding film can occur due to the gas used for the ashing penetrating into the opening and etching a part of the barrier film. Furthermore, there are cases in which a barrier film is formed on a surface of metal wiring in a semiconductor device. In such cases as well, a partial loss of the barrier film may occur when a contact hole is formed. Due to this, detachment of the barrier film can occur, and the quality of the semiconductor device can be deteriorated. Furthermore, in the case of the photoelectric conversion device, a gap can be formed in the surface of the light-shielding film due to the partial loss of the barrier film, and the quality of the photoelectric conversion device can be deteriorated due to the generation of stray light, etc.

SUMMARY OF THE INVENTION

According to one aspect of the present invention, there is provided a semiconductor device comprising: a semiconductor layer; a metal layer disposed above a surface of the semiconductor layer; a first barrier portion that covers a first portion of a surface of the metal layer; a second barrier portion that covers a second portion of the surface of the metal layer; an insulating film that covers the metal layer and the first and second barrier portions; and a metal member that is disposed in an opening portion provided in the insulating film, the metal member positioned on a third portion of the surface of the metal layer that is between the first portion and the second portion, wherein the metal member is positioned between the first barrier portion and the second barrier portion, and a part of the insulating film is disposed between the metal member and the first barrier portion and between the metal member and the second barrier portion.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

Configuration Example 1

Figure 1:
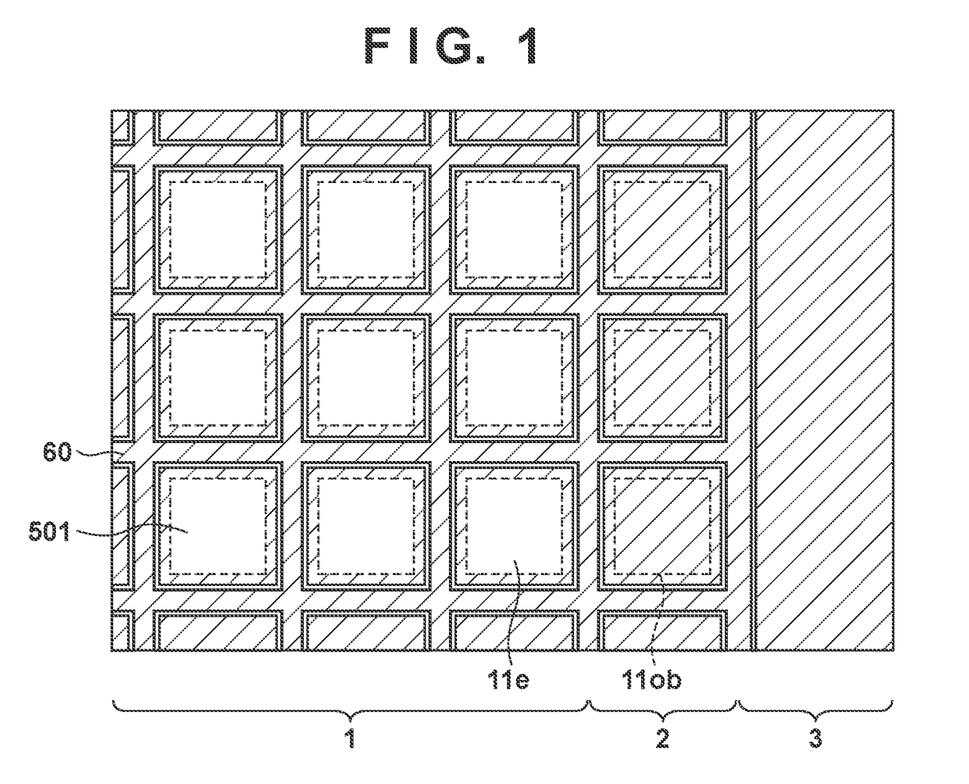
FIG. 1 is a plan view of a semiconductor device pertaining to configuration example 1.

FIG. 1 shows a plan view of a semiconductor device pertaining to configuration example 1. In FIG. 1, a photoelectric conversion device is illustrated as a semiconductor device. The photoelectric conversion device includes a light-receiving pixel area 1 and a light-shielded pixel area (optical black (OB) pixel area) 2. The light-receiving pixel area 1 is an area in which a plurality of photoelectric converters (first photoelectric converters) 11e are disposed so as to form a plurality of rows and a plurality of columns. In other words, the light-receiving pixel area 1 is an area in which pixels (first pixels) including the first photoelectric converters 11e are disposed so as to form a plurality of rows and a plurality of columns. The signals from the first photoelectric converters (first pixels) 11e in each column in the light-receiving pixel area 1 are output via a column signal line (not illustrated). The light-shielded pixel area 2 is an area in which pixels (second pixels) including a plurality of photoelectric converters (second photoelectric converters) 11ob that are shielded from entering light are disposed so as to form a plurality of rows and a plurality of columns. In other words, the light-shielded pixel area 2 is an area in which a plurality of pixels (second pixels) that are shielded from light are disposed. The plurality of pixels that are shielded from light can be used to detect a black level, and thus are referred to as optical black (OB) pixels herein.

A buffer area including a pixel structure may be included between the light-receiving pixel area 1 and the light-shielded pixel area 2. The first pixels in the light-receiving pixel area 1 and the second pixels in the light-shielded pixel area 2 can each include, in addition to the photoelectric converter, a circuit element that forms a circuit for outputting, to the outside of the pixel, a signal that is in accordance with the electric charge generated by the photoelectric converter.

A peripheral circuit area 3 is an area that can include circuits for controlling the pixels, such as a row selection circuit, a readout circuit, and a column selection circuit. Signals are read out from the pixels by the circuits disposed in the peripheral circuit area 3. The plurality of first photoelectric converters 11e disposed in the light-receiving pixel area 1 and the plurality of second photoelectric converters 11ob disposed in the light-shielded pixel area 2 can be disposed so as to form, all together, a photoelectric conversion array in which pixels are disposed in a matrix in a plurality of rows and a plurality of columns. In the following, the first photoelectric converters 11e and the second photoelectric converters 11ob will be referred to as photoelectric converters 11 wherever it is unnecessary to distinguish the first photoelectric converters 11e and the second photoelectric converters 11ob from one another. The row selection circuit can select a row in the photoelectric conversion array, and can drive the photoelectric converters in the selected row. The signals from the photoelectric converters in the row selected by the row selection circuit are output to the readout circuit via the column signal lines. The readout circuit is a circuit that reads out the signals output to the column signal lines. The column selection circuit sequentially selects and outputs the plurality of signals read out by the readout circuit from the plurality of column signal lines. The light-shielded pixel area 2 and the peripheral circuit area 3 can be shielded from light. To achieve the shielding from light, light-shielding walls may be disposed around the first pixels, and in such a case, a light-shielding wall may be disposed between adjacent pixels. In addition, light-shielding walls may be disposed around the second pixels.

Figure 2A:
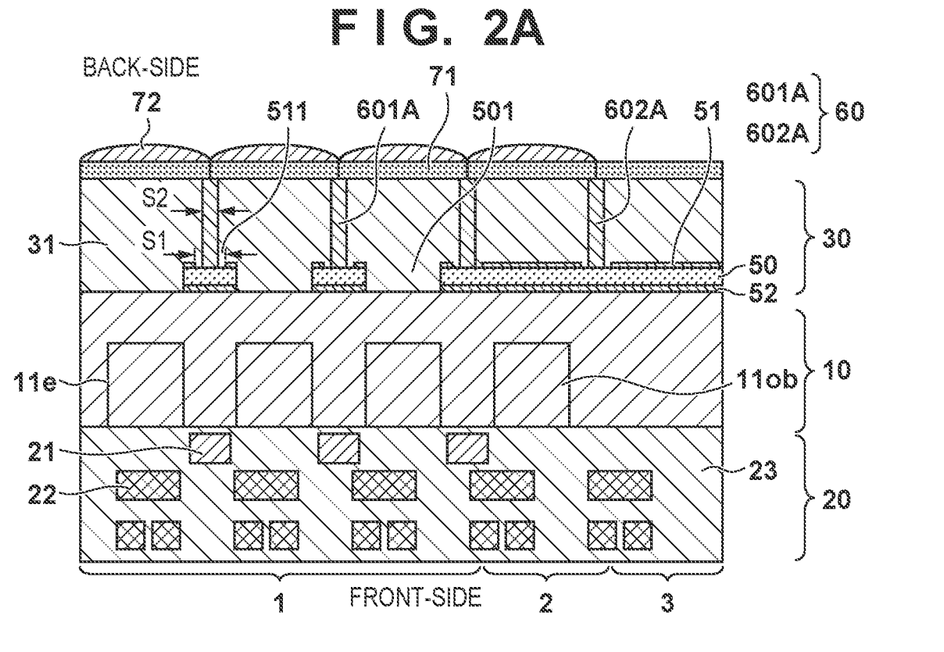
FIGS. 2A to 2C are cross-sectional views of the semiconductor device pertaining to configuration example 1.

FIG. 2A is a schematic cross-sectional diagram of the photoelectric conversion device in FIG. 1. In this description, the terms "first conductivity type" and "second conductivity type" are used to distinguish the N type semiconductor and the P type semiconductor from one another. If the first conductivity type is the N type semiconductor, the second conductivity type is the P type semiconductor, and if the first conductivity type is the P type semiconductor, the second conductivity type is the N type semiconductor. The photoelectric conversion device includes a semiconductor layer 10. The semiconductor layer 10 is a first conductivity type (e.g., P type semiconductor) semiconductor area, for example. First conductivity type semiconductor areas and second conductivity type semiconductor areas can be disposed in the semiconductor layer 10. The plurality of photoelectric converters 11 each include a second conductivity type semiconductor area that forms a part of a photodiode.

FIG. 2A illustrates a photoelectric conversion device configured as a back-side illumination photoelectric conversion device in which gate electrodes 21 and a wiring structure 20 are formed on the opposite side of the semiconductor layer 10 from a light-shielding film 50 that forms a light-shielding layer. However, the photoelectric conversion device may be configured as a front-side illumination photoelectric conversion device. The photoelectric conversion device includes the multilayer wiring structure 20, which is disposed on the front-side (the side of the semiconductor layer 10 on which the wiring structure 20 is formed in FIG. 2A) of the semiconductor layer 10, and a light-shielding structure 30 disposed on the back-side (the opposite side from the side of the semiconductor layer 10 on which the wiring structure 20 is formed in FIG. 2A) of the semiconductor layer 10. The front-side of the semiconductor layer 10 (the lower side in the drawing) can be an interface between the semiconductor forming the semiconductor layer 10 and an insulator forming a part of the multilayer wiring structure 20. Here, the wiring structure 20 can include transistor gate electrodes 21, wiring layers 22, and an insulating film 23. In the case of a back-side illumination photoelectric conversion device, the wiring layers 22 can be freely disposed because the wiring layers 22 do not inhibit the entry of light.

The photoelectric conversion device further includes color filter layers 71 that are disposed on the back-side of the semiconductor layer 10 (in other words, above the back-side (upper side in the drawing) or main surface of the semiconductor layer 10; the opposite side of the semiconductor layer 10 from the side on which the wiring structure 20 is present). Furthermore, the photoelectric conversion device can include a plurality of microlenses 72 (on-chip lenses) disposed on the back-side of the semiconductor layer 10. Here, as schematically illustrated in FIG. 2A, the color filter layers 71 can be disposed between the plurality of microlenses 72 and the back-side of the semiconductor layer 10. The photoelectric conversion device may include a plurality of interlayer lenses between the back-side of the semiconductor layer 10 and the color filter layers 71. Light enters the plurality of first photoelectric converters 11e via the microlenses 72, the color filter layers 71, and the back-side of the semiconductor layer 10. Seen in a different way, it can be said that light enters the back-side of the semiconductor layer 10 via the microlenses 72, the color filter layers 71, and the light-shielding structure 30.

The light-shielding structure 30 includes light-shielding walls 60 (601A and 602A illustrated as examples in FIG. 2A), the light-shielding film 50, and an insulating film 31. The light-shielding structure 30 may have a structure in which the light-shielding walls 60 and the light-shielding film 50 are buried in the insulating film 31. The light-shielding film 50 is disposed on the side of the back-side of the semiconductor layer 10 (in other words, above the back-side (upper side in the drawing) or main surface of the semiconductor layer 10). A plurality of openings 501 corresponding one-to-one with the first photoelectric converters 11e in the light-receiving pixel area 1 are defined in the light-shielding film 50.

The light-shielding walls 60 may also be disposed in the light-shielded pixel area 2, and, among the light-shielding walls 60, light-shielding walls 602A disposed in the light-shielded pixel area 2 may have a structure similar to that of the light-shielding walls 601A disposed in the light-receiving pixel area 1. Here, while the light-shielding walls 601A and 602A are illustrated in the drawing as the light-shielding walls 60, the light-shielding walls 60 may be disposed in a lattice pattern (may be a rectangular lattice), and may or may not be disposed in the peripheral circuit area 3.

In an orthogonal projection (i.e., a "plan view") to the back-side of the semiconductor layer 10, the light-shielding walls 60 can include portions that are disposed between first photoelectric converters 11e that are disposed at the closest position to the light-shielded pixel area 2, among the plurality of first photoelectric converters 11e, and second photoelectric converters 11ob that are disposed at the closest position to the light-receiving pixel area 1, among the plurality of second photoelectric converters 11ob. The portions are effective for preventing light having entered the insulating film 31 in the light-shielded pixel area 2 from entering the first photoelectric converters 11e in the light-receiving pixel area 1. The light-shielding walls 60 can be disposed around each of the light-receiving pixels and light-shielded pixels, or can be disposed between pixels.

In this example, the light-shielding film 50 is disposed on the side of the back-side of the semiconductor layer 10. Specifically, the light-shielding film 50 can be disposed between the light-shielding walls 60 and the back-side of the semiconductor layer 10. In an orthogonal projection to the back-side of the semiconductor layer 10, the light-shielding film 50 includes light-shielding portions that are disposed to extend in parallel on the back-side of the semiconductor layer 10 so as to cover the plurality of second photoelectric converters 11ob in the light-shielded pixel area 2.

In the light-receiving pixel area 1, entering light enters the first photoelectric converters 11e via the insulating film 31 present in the openings 501 disposed in the light-shielding film 50. In the light-shielded pixel area 2, entering light is blocked or attenuated by the light-shielding film 50. That is, the second photoelectric converters 11ob in the light-shielded pixel area 2 are shielded from light by the light-shielding film 50. The wording "shield from light/block light" as referred to herein can mean that light is completely blocked, and also can mean that light is attenuated.

The light-shielding walls 60 and the light-shielding film 50 are beneficially formed from a material that has low light transmittance and that can be easily processed. The light-shielding walls 60 and the light-shielding film 50 may be formed from a metal material. The light-shielding walls 60 can be metal members that can be formed from at least one material among tungsten, aluminum, titanium, tantalum, and copper. Furthermore, the light-shielding film 50 can be formed as a metal layer of at least one of aluminum, titanium, tantalum, and copper. The light-shielding walls 60 and the light-shielding film 50 may be formed from a combination of different materials, e.g., tungsten for the light-shielding walls 60, and aluminum for the light-shielding film 50.

Barrier films 51 and 52 are disposed on the surface of the light-shielding film 50. The barrier films 51 and 52 are disposed so as to be in contact with the surface of the light-shielding film 50. The barrier films 51 and 52 may be formed from a metal film of titanium, tantalum, etc., and/or a metal nitride film of titanium nitride, tantalum nitride, etc. The barrier films 51 and 52, which are formed from a metal or a metal compound in such a manner, can also be referred to as barrier metal films.

As illustrated in FIG. 2A, barrier-film opening portions 511 are disposed in the barrier film 51 at portions corresponding to the light-shielding walls 601A and 602A. The light-shielding walls 60 are positioned inside the barrier-film opening portions 511. A structure is adopted in which a width S1 of the barrier-film opening portions 511 is wider than a width S2 of the light-shielding walls 60. The barrier-film opening portions 511 are disposed such that the bottom surfaces of the light-shielding walls 60 are included inside the barrier-film opening portions 511, and such that the barrier-film opening portions 511 extend in a direction that is parallel with the surface of the barrier film 51. There are gaps between the inside of a barrier-film opening portion 511 (can be regarded as lateral portions of the barrier film 51) and a light-shielding wall 60, and the insulating film 31 is disposed in the gaps. In other words, it can be said that the gaps are filled by parts of the insulating film 31. Thus, the lateral portions of the barrier film 51 can prevent a partial loss of the barrier film 51 caused by ashing.

Next, the configuration near a barrier-film opening portion 511 in which a light-shielding wall 60 is disposed will be described in detail with reference to FIGS. 2B and 2C. The barrier film 51 is positioned on the surface of a first portion 512 and on the surface of a second portion 513 of the surface of the light-shielding film 50. The first portion 512 is an area on one side of the light-shielding wall 60, and the second portion 513 is an area on the other side of the light-shielding wall 60. The barrier film 51 includes a first barrier portion 516 and a second barrier portion 517. The first portion 512 is covered by the first barrier portion 516. The second portion 513 is covered by the second barrier portion 517. The light-shielding wall 60 is positioned on the surface of a third portion 61 of the surface of the light-shielding film 50 that is positioned between the first portion 512 and the second portion 513. The light-shielding wall 60 is positioned between the first barrier portion 516 and the second barrier portion 517.

A fourth portion 514 of the surface of the light-shielding film 50 that is positioned between the first barrier portion 516 and the light-shielding wall 60 is covered by a part of the insulating film 31. Furthermore, a fifth portion 515 of the surface of the light-shielding film 50 that is positioned between the second barrier portion 517 and the light-shielding wall 60 is also covered by a part of the insulating film 31. Accordingly, parts of the insulating film 31, which covers the light-shielding film 50, the first barrier portion 516, and the second barrier portion 517, are disposed between a lateral surface of the first barrier portion 516 and the light-shielding wall 60 and between a lateral surface of the second barrier portion 517 and the light-shielding wall 60.

An example in which the light-shielding wall 60 includes a metal member 62 and a barrier film 53, and the barrier film 53 is disposed between the metal member 62 and the insulating film 31 and between the metal member 62 and the light-shielding film 50 will be described with reference to FIG. 2C. The metal member 62 forming the light-shielding wall 60 may be formed from at least one material among tungsten, aluminum, titanium, tantalum, and copper. The barrier film 51 can be referred to as a first barrier film (first barrier metal film), and the barrier film 53 can be referred to as a second barrier film (second barrier metal film). In this example as well, the light-shielding wall 60 is positioned between the first barrier portion 516 and the second barrier portion 517, similarly to the example in FIG. 2B. In this example, the barrier film 53 is positioned between the first barrier portion 516 and the second barrier portion 517. Furthermore, the metal member 62 is also positioned between the first barrier portion 516 and the second barrier portion 517. However, if the thickness of the barrier film 53 is greater than or equal to the thickness of the barrier film 51 between the bottom surface of the light-shielding wall 60 and the surface of the light-shielding film 50, the metal member 62 of the light-shielding wall 60 would end up not being positioned between the first barrier portion 516 and the second barrier portion 517. In such a case, only the barrier film 53 of the light-shielding wall 60 can be positioned between the first barrier portion 516 and the second barrier portion 517.

Figures 2B, 2C:
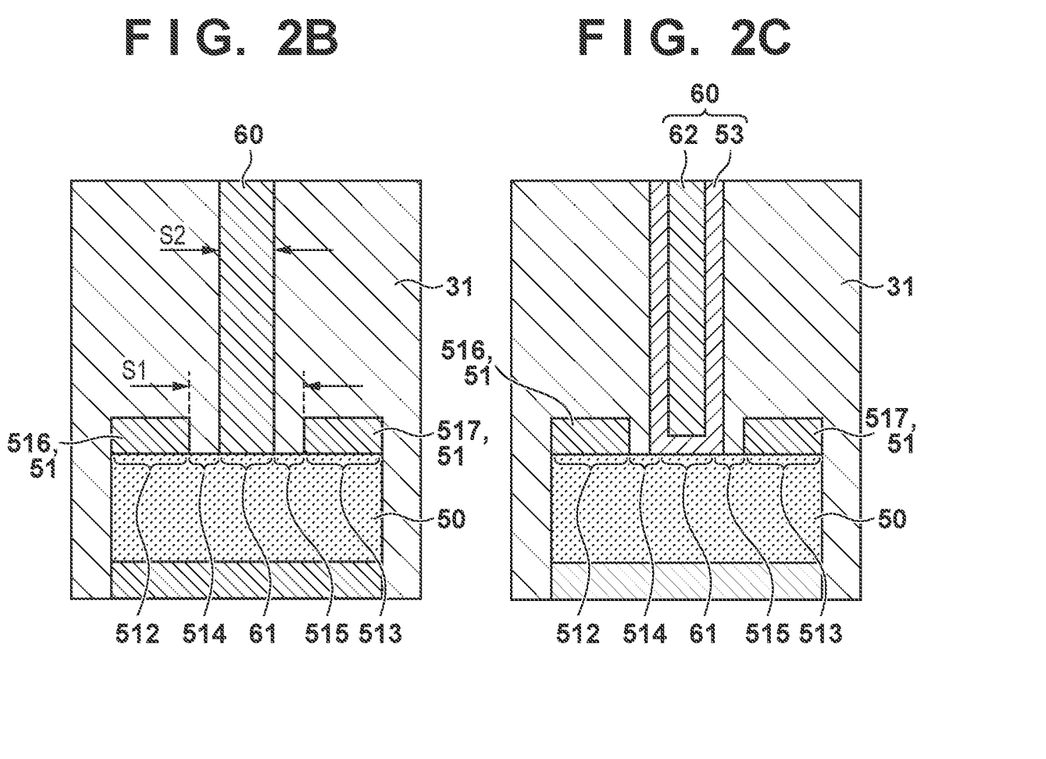

In this example as well, the fourth portion 514 of the surface of the light-shielding film 50 between the first barrier portion 516 and the light-shielding wall 60 is covered by the insulating film 31, similarly to in FIG. 2B. Furthermore, the fifth portion 515 of the surface of the light-shielding film 50 between the second barrier portion 517 and the light-shielding wall 60 is also similarly covered by the insulating film 31. By the insulating film 31 being disposed between the lateral surfaces of the barrier film 51 and the light-shielding wall 60 in such a manner, a partial loss of the barrier film 51 caused by ashing of the lateral portions of the barrier film 51 can be prevented. Similarly to the barrier film 51 including the first barrier portion 516 and the second barrier portion 517, the barrier film 53 can be formed from a metal film of titanium, tantalum, etc., and/or a metal nitride film of titanium nitride, tantalum nitride, etc. A barrier film 53 that is formed from a metal or a metal compound in such a manner can also be referred to as a barrier metal film. A barrier metal film can function as a light-shielding material. Thus, based on a case in which the barrier film 53 is a light-shielding material, it is indicated here that the light-shielding wall 60 includes the barrier film 53. However, if the barrier film 53 is not a light-shielding material (i.e., is a light-transmitting material), the light-shielding wall 60 would be formed by only the metal member 62, and a barrier film 53 that is not a light-shielding material would be positioned between the metal member 62 and the light-shielding film 50.

Here, the relationship between the width of a light-shielding wall and the width of an opening portion disposed in a barrier film has been described taking a photoelectric conversion device as an example. However, there are cases in which, in a semiconductor device in which wiring is formed from a metal layer of aluminum, copper, etc., a barrier film is formed on the surface of the metal layer forming the wiring. By disposing an insulating film as in present configuration example 1 when connecting a metal member such as a contact plug to the wiring in such a case as well, the deterioration of the quality of the semiconductor device can be suppressed. In such a case, the opening in the barrier film is made larger than the opening of a contact hole. The deterioration of the quality of the semiconductor device can be suppressed because a partial loss of the barrier film can be prevented by disposing parts of the insulating film between the contact hole and the lateral portions of the barrier film inside the opening in the barrier film.

<Manufacturing Method for Semiconductor Device Pertaining to Configuration Example 1>

A manufacturing method for the semiconductor device pertaining to configuration example 1 will be described with reference to FIGS. 3A to 4D.

First, first and second conductivity semiconductor areas are formed for each pixel in the semiconductor layer 10. If the photoelectric converters 11 are first conductivity type photoelectric converters, the wells around the photoelectric converters 11 would be second conductivity type wells. The multilayer wiring structure 20, which is constituted of the gate electrodes 21, the plurality of wiring layers 22, and the insulating film 23 formed of multiple layers, is formed on the front-side (the lower side in FIG. 3A) of the semiconductor layer 10. A planarizing film 12 is disposed on the back-side (the opposite side from the side of the semiconductor layer 10 on which the wiring structure 20 is formed) of the semiconductor layer 10. The planarizing film 12 can be formed from $SiO_2$.

Figure 3A:
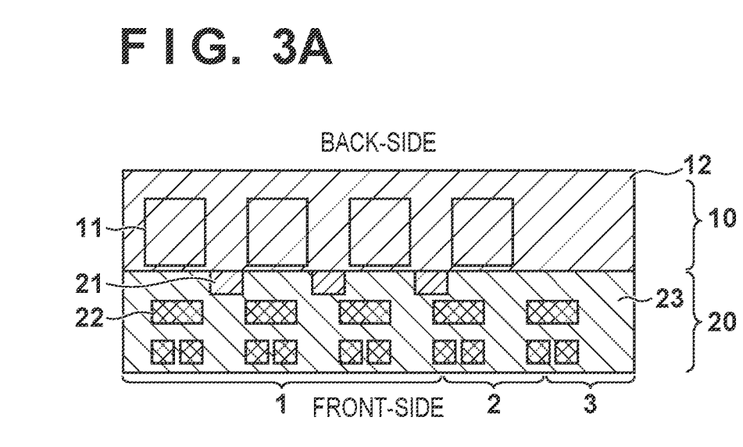
FIGS. 3A to 3D are diagrams describing a manufacturing method for the semiconductor device pertaining to configuration example 1.
Figure 3B:
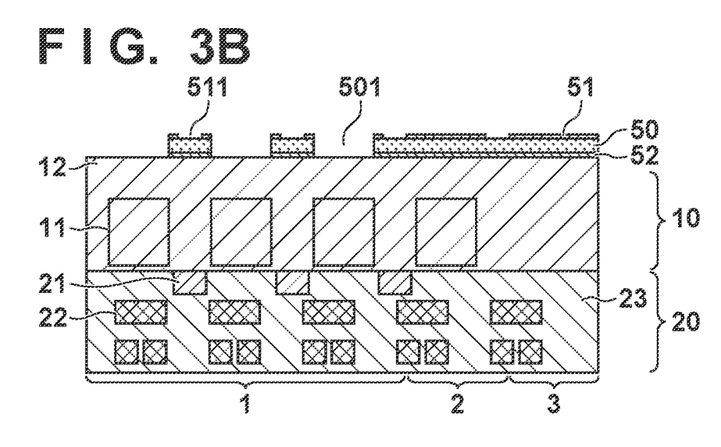

Next, as illustrated in FIG. 3B, the top of the planarizing film 12 is planarized, and the light-shielding film 50 and the barrier films 51 and 52 are formed. The light-shielding film 50 can be formed from a metal layer. It is beneficial for the light-shielding film 50 to be formed from aluminum. The barrier films 51 and 52 can be formed from titanium, tantalum, or nitrogen compounds thereof. Then, the plurality of openings 501 corresponding one-to-one with the plurality of first photoelectric converters 11e in the light-receiving pixel area 1 are formed in the light-shielding film 50 and the barrier films 51 and 52 by dry etching, etc.

Next, the barrier-film opening portions 511 are formed in the barrier film 51 by dry etching, etc., so that the barrier-film opening portions 511 correspond to the positions where the light-shielding walls 60 (601A and 602A illustrated as examples) are to be formed. In a case in which the light-shielding walls 60 are to be formed, it is desirable that the value of the width S1 of the barrier-film opening portions 511 be not too great, while the width S1 needs to be greater than the width S2 of the light-shielding walls 60. The barrier-film opening portions 511 are opened so as to have a size such that the barrier film 51 and the light-shielding walls 60 do not contact one another when the light-shielding walls 60 are positioned in the barrier-film opening portions 511. Note that the light-shielding film, the barrier films, and the barrier-film opening portions 511 in the light-receiving pixel area 1 can be formed together with those formed in the light-shielded pixel area 2.

Figure 3C:
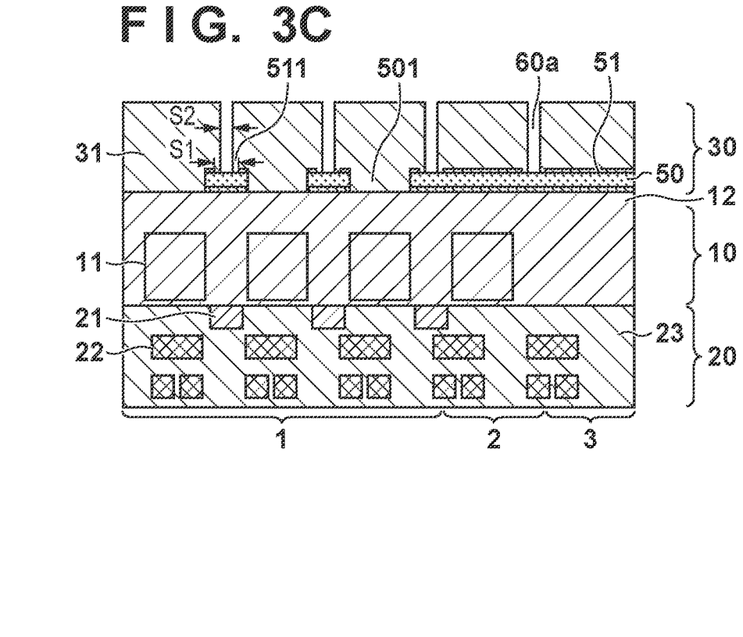
Figure 3D:
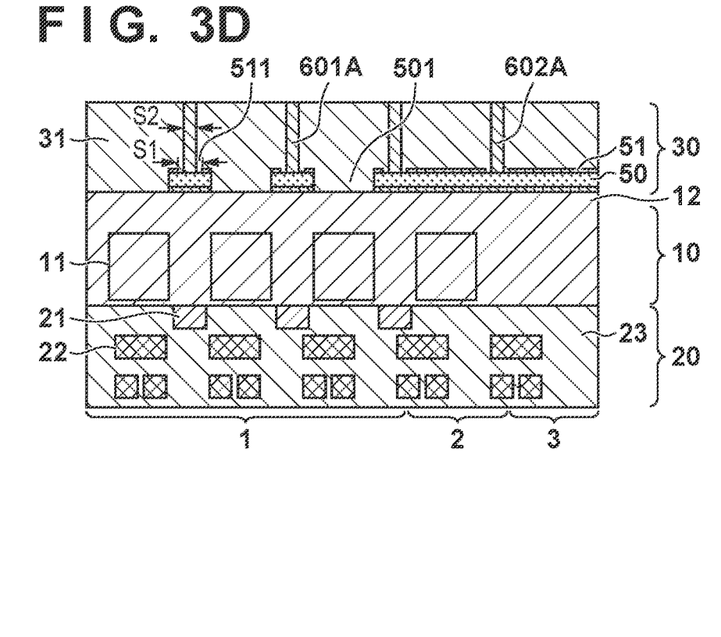

Next, a planarizing film is formed on the surface of the light-shielding film 50 by forming a film of an inorganic material that becomes the planarizing film and then planarizing the film by chemical mechanical polishing (CMP), etc. Here, $SiO_2$ can be used as the inorganic material. Subsequently, opening portions 60a are formed by patterning a photoresist and etching predetermined portions of the insulating film 31, and the light-shielding film 50 is exposed at the bottom parts of the opening portions 60a. As a result of the etching, the opening portions 60a are formed in the insulating film 31 so that the opening portions 60a correspond to the portions where the light-shielding walls 60 are to be formed, as illustrated in FIG. 3C. Then, by burying a metal material such as tungsten in the opening portions 60a and then performing CMP on the entire surface, the light-shielding walls 60 (601A, 602A) are formed in the portions of the opening portions 60a, as illustrated in FIG. 3D. Note that, when the metal material is buried in an opening portion 60a, a barrier film can be formed on the inner circumferential surface of the opening portion 60a as a adhesion layer, as illustrated in FIG. 2C. This adhesion layer is expected to achieve a diffuse-reflection reducing effect by reducing reflection at the light-shielding layer interface.

Immediately after the dry etching of the opening portions 60a for the light-shielding walls 60, a reactive ion ashing process for removing residual photoresist is performed. It is beneficial to perform the reactive ion ashing process under a temperature of 200° C. or higher while using a fluorine-containing gas.

Besides the above-described process conditions, the reactive ion ashing process may be performed under a temperature of 100° C. or lower, and ashing may be performed using only oxygen gas.

Furthermore, after the process for forming the barrier film 51, an insulating film of SiN, etc., may be disposed as a reflection-preventing layer. This reflection-preventing layer can reduce stray light to the light-receiving pixel area 1. In addition, the reflection-preventing layer can also serve as an etching stopper film during the forming of the opening portions 60a, which are opened in the portions where the light-shielding walls 60 are to be formed.

Figure 4A:
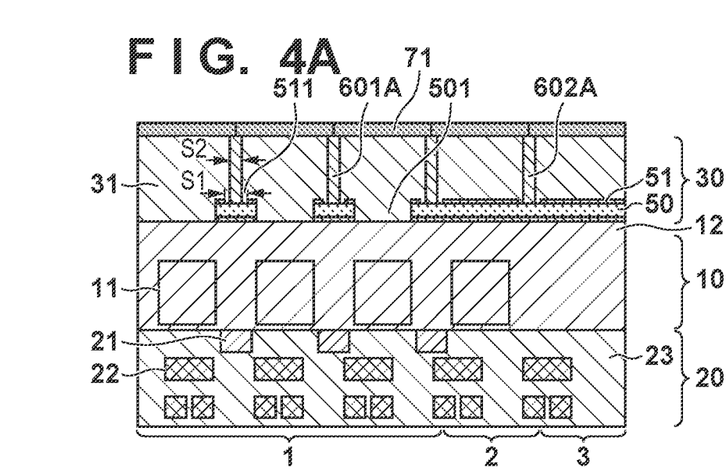
FIGS. 4A to 4D are diagrams describing the manufacturing method for the semiconductor device pertaining to configuration example 1.

Next, the surfaces of the light-shielding walls 60 and the insulating film 31 are planarized, and the color filter layers 71 are formed by spin-coating photosensitive resins that contain coloring matters such as pigments or dyes, as illustrated in FIG. 4A. The gaps between the color filter layers 71 and the light-shielding walls 60 are desirably made as small as possible, considering the resistance to color mixing in the case of a high incident angle.

Figure 4B:
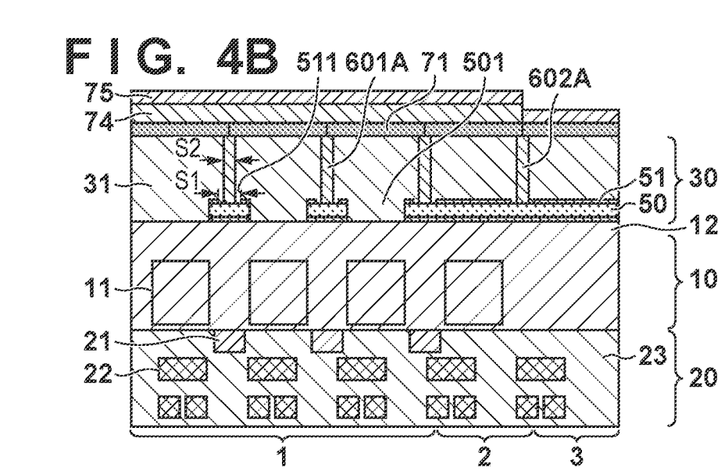

Next, a microlens material 74 and a photoresist 75 are formed on the color filter layers 71, as illustrated in FIG. 4B. For the microlens material 74, resin-based organic materials, inorganic materials such as SiN, organic-inorganic hybrid materials, etc., can be used, as mentioned above. Furthermore, for the photoresist 75, a photosensitive material containing a novolac resin as the main component can be used.

Figure 4C:
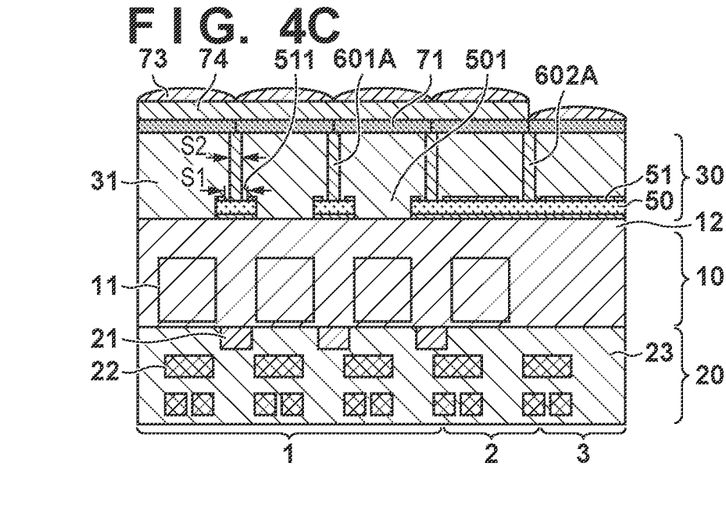
Figure 4D:
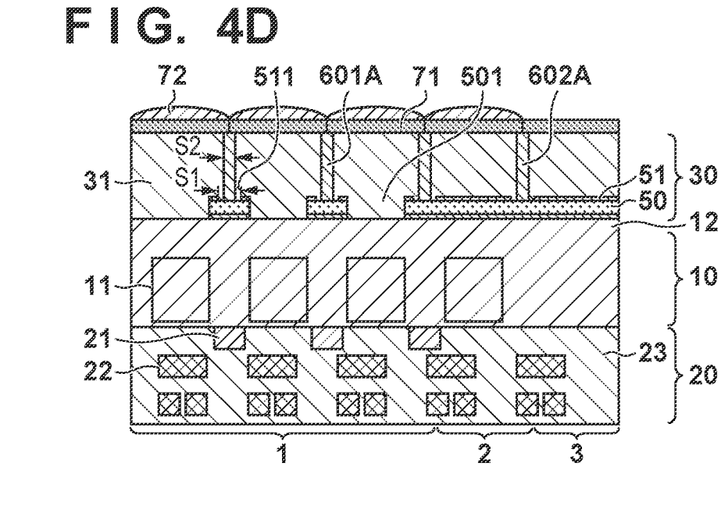

Subsequently, a photoresist 73 having the shape of lenses is formed by shaping the photoresist 75 as illustrated in FIG. 4C, and the shape is transferred to the microlens material 74 to form the microlenses 72 as illustrated in FIG. 4D. In such a manner, the semiconductor device pertaining to configuration example 1, which has the cross-sectional configuration illustrated in FIG. 2A, can be manufactured.

The present configuration example is also applicable when forming a contact plug. In the case of wiring in a semiconductor device, an insulating film is formed on the wiring, a contact hole is opened, and a contact plug is formed. Here, an opening portion having a larger area than the contact hole is formed in advance in a barrier film on the surface of the wiring. The contact hole is then formed so that the contact hole corresponds to this opening portion. Here, the size of the contact hole is set so that gaps are formed between the contact hole and the inside of the opening in the barrier film. Due to parts of the insulating film being interposed in these gaps, a partial loss of the barrier film can be prevented.

Configuration Example 2

Figure 5:
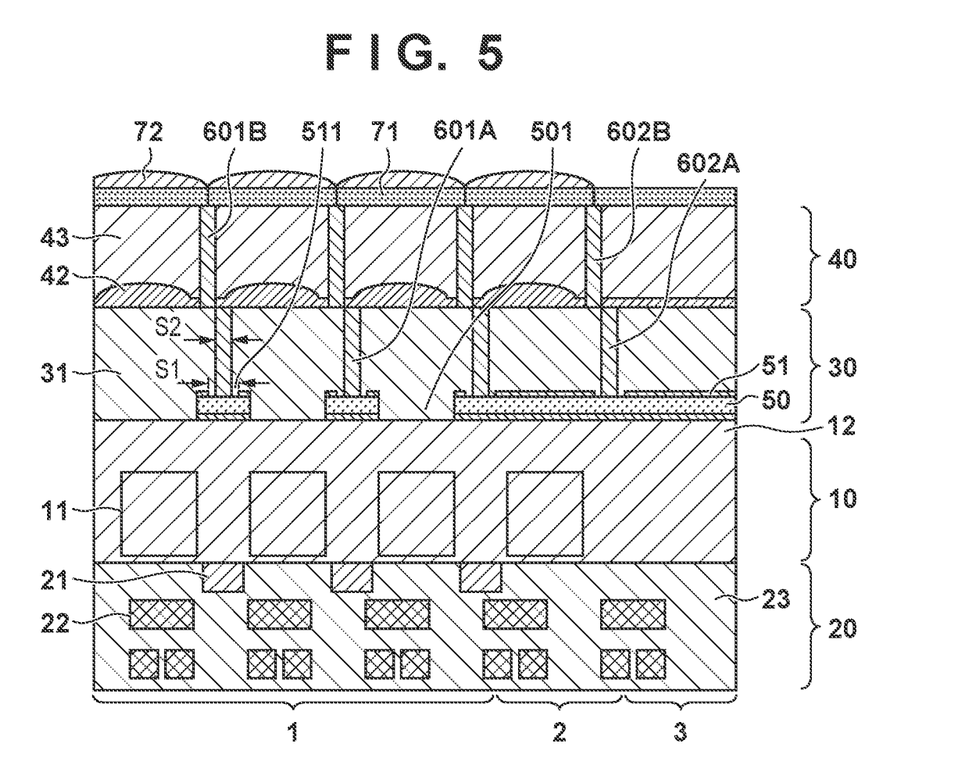
FIG. 5 is a cross-sectional view of a semiconductor device pertaining to configuration example 2.

With reference to FIG. 5, a semiconductor device pertaining to configuration example 2 will be described based on an example in which the semiconductor device is a photoelectric conversion device. In this example, the photoelectric conversion device has a structure in which light-shielding walls are constituted of two tiers, namely light-shielding walls 601A and light-shielding walls 602A constituting a first tier, and light-shielding walls 601B and light-shielding walls 602B constituting a second tier. However, the number of tiers is not limited to this. Furthermore, interlayer lenses 42 are disposed in this example. The two-dimensional arrangement of the light-receiving pixels and light-shielded pixels is similar to that in configuration example 1.

In this example, a structure is adopted in which, on the light-shielding structure 30 constituting a first tier and a planarizing film, a light-shielding structure 40 constituting a second tier is formed, and a planarizing film is further disposed. Furthermore, the interlayer lenses 42 are disposed at the boundary portion between the light-shielding structure 30 constituting the first tier and the light-shielding structure 40 constituting the second tier. The light-shielding walls 601A and 602A constituting the first tier are disposed inside the barrier-film opening portions 511. In configuration example 2 as well, it can be said that the size (width) S1 of the barrier-film opening portions 511 is greater or wider than the size (width) S2 of the light-shielding walls. The lateral portions of the barrier film 51 inside a barrier-film opening portion 511 are not in contact with a light-shielding walls 601A, and there are gaps in which parts of the insulating film 31 are disposed.

A manufacturing method for the photoelectric conversion device pertaining to FIG. 5 will be described with reference to FIGS. 6A to 6D. Up to the forming of the light-shielding walls 601A constituting the first tier, the forming of elements can be performed in a similar manner as in the manufacturing method pertaining to configuration example 1.

Figure 6A:
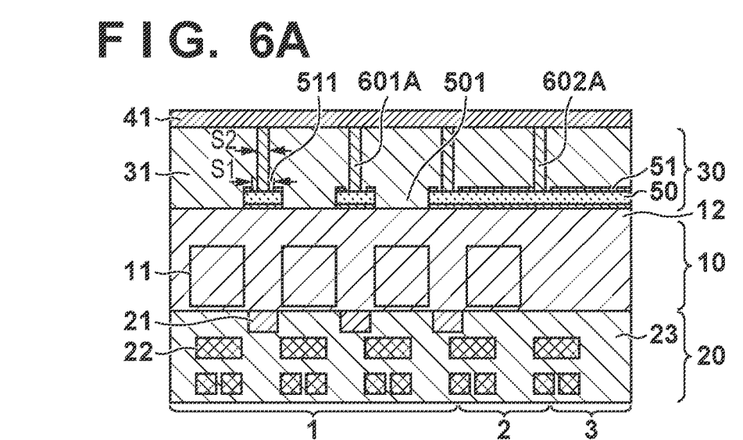
FIGS. 6A to 6D are diagrams describing a manufacturing method for the semiconductor device pertaining to configuration example 2.
Figure 6B:
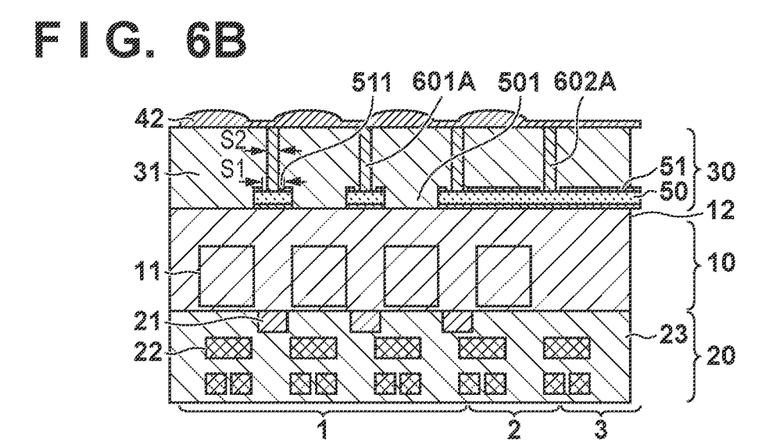

Next, a film of an interlayer lens material 41 is formed on the light-shielding wall layer constituting the first tier, as illustrated in FIG. 6A. The interlayer lens material 41 is formed from SiN, SiON, etc. Next, the interlayer lenses 42 are formed as illustrated in FIG. 6B, by transferring the lens shape pattern of a photoresist (not illustrated) in a similar manner as in the method for forming the microlenses 72.

Figure 6C:
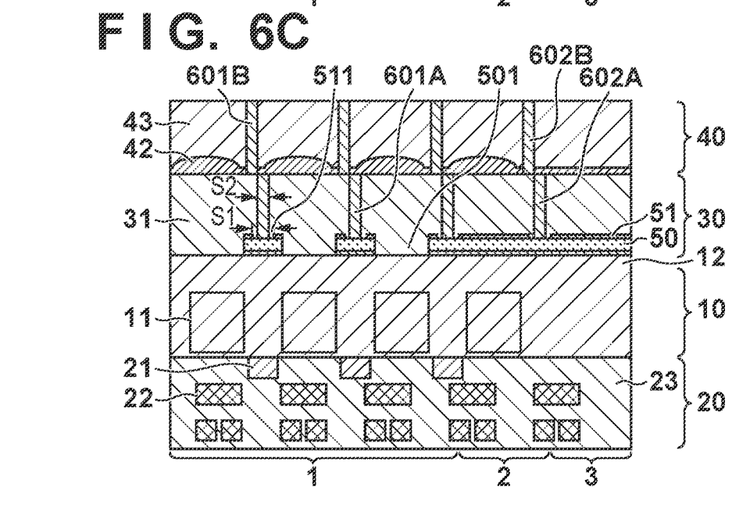
Figure 6D:
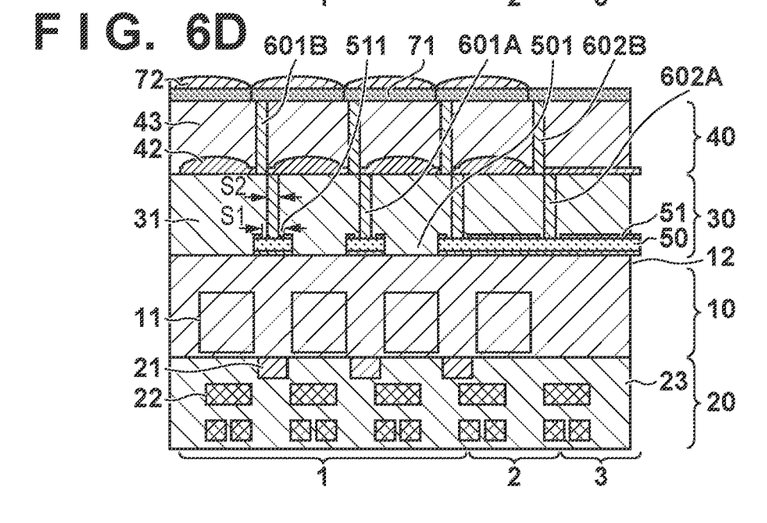

Next, the light-shielding walls 601B and 602B constituting the second tier are formed in a similar manner as the manner in which the light-shielding walls 601A constituting the first tier are formed. The light-shielding walls 601A constituting the first tier and the light-shielding walls 601B constituting the second tier form a two-tier structure in a direction intersecting with the surface that light enters. Here, the light-shielding walls constituting the second tier can be disposed so as to be displaced from the top surfaces of the light-shielding walls constituting the first tier. The displacement amount in such a case is determined in accordance with the direction of entering light. Thus, an improvement in light-shielding property, a reduction in stray light, etc., can be expected. Note that three or more tiers of light-shielding walls may be disposed, and light-shielding walls are formed in a similar manner in such a case as well.

Then, the color filter layers 71 and the microlenses 72 are formed in a similar manner as in the method of forming the color filter layers 71 and the microlenses 72 described in configuration example 1. The gaps between the color filter layers 71 and the uppermost light-shielding walls 60 are desirably made as small as possible, considering the resistance to color mixing in the case of a high incident angle.

Configuration Example 3

Figure 7:
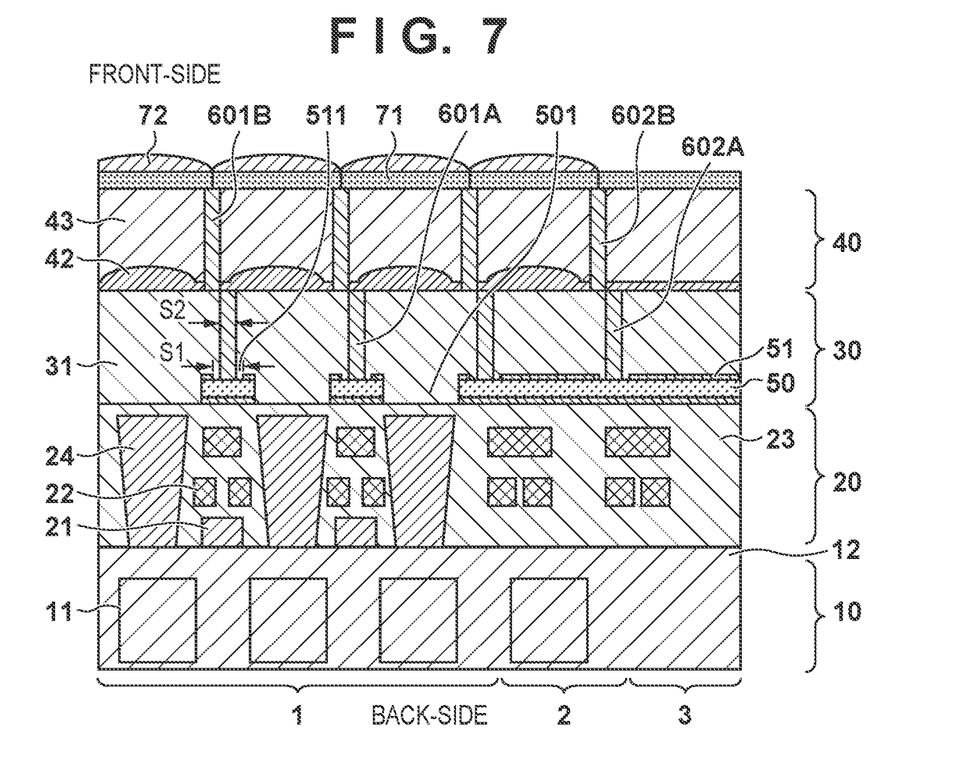
FIG. 7 is a cross-sectional view of a semiconductor device pertaining to configuration example 3.

Configuration example 3 will be described with reference to FIG. 7. The present example is a front-side illumination photoelectric conversion device. That is, the present example is an example in which the multilayer wiring structure 20 is disposed on the front-side (the upper side in the drawing; between the semiconductor layer 10 and the microlenses 72) of the semiconductor layer 10. In this example, waveguides 24 can be included in the wiring structure 20.

Two tiers of light-shielding walls are disposed in this example as well, and the interlayer lenses 42 are disposed in the light-shielding structure 40 constituting the second tier. The interlayer lenses 42 may be present in the light-shielded pixel area 2, and need not be present in the light-receiving pixel area 1. Furthermore, the interlayer lenses 42 may be formed in the light-shielding structure 30 constituting the first tier. The waveguides 24 guide light, entering the waveguides 24 via the microlenses 72 and the interlayer lenses 42, to the photoelectric converters 11. The area of the side of a waveguide 24 that light enters is larger than the area of the photoelectric converter 11-side of the waveguide 24 from which light is output, and the waveguides 24 may be provided with tapered shapes.

<Example of Application to Equipment>

Figure 8:
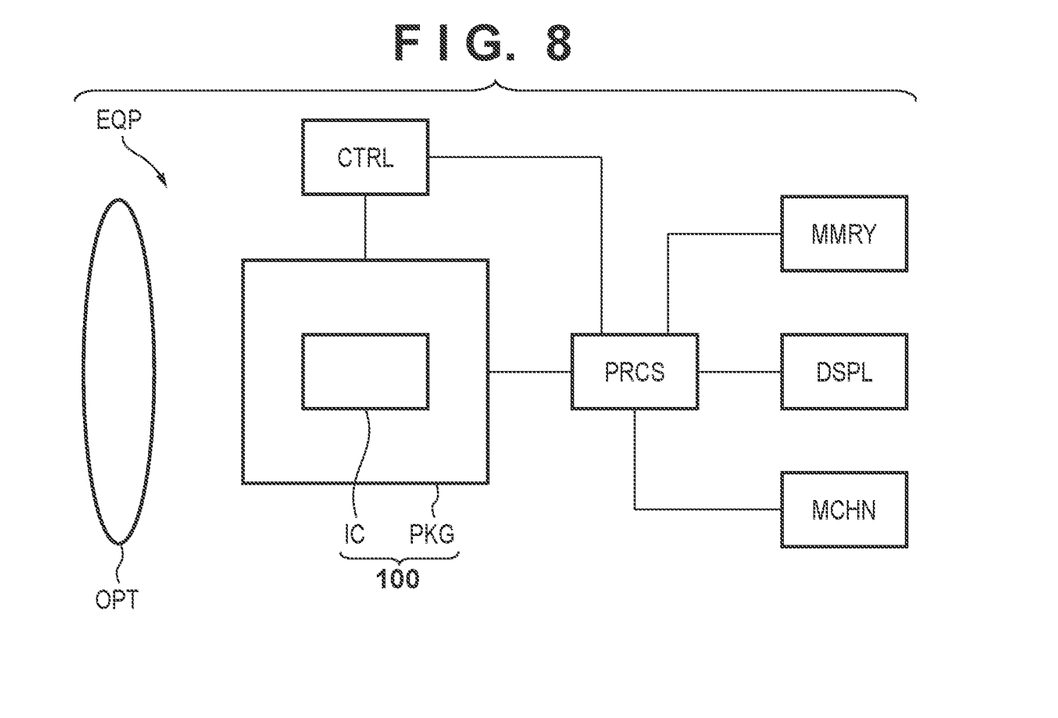
FIG. 8 illustrates an example of equipment in which a semiconductor device is installed.

FIG. 8 is a schematic diagram of equipment EQP in which a photoelectric conversion device configured as an image-capturing device 100 is installed. The equipment EQP can be electronic or information equipment such as a camera or a smartphone. Furthermore, the equipment EQP may also be transportation equipment such as a car, a ship, or an airplane.

The image-capturing device 100 can include, in addition to a semiconductor device IC that includes a semiconductor layer (semiconductor chip), a package PKG that houses the semiconductor device IC. The package PKG can include a base on which the semiconductor device IC is fixed, a lid made of glass, etc., that faces the semiconductor device IC, and connection members such as bonding wires and bumps that connect terminals provided to the base and terminals provided to the semiconductor device IC. The semiconductor device IC can be housed inside a housing of the image-capturing device 100.

The equipment EQP can further include at least one of an optical system OPT, a control device CTRL, a processing device PRCS, a display device DSPL, and a memory MMRY. The optical system OPT forms optical images in the image-capturing device 100, and can be lenses, a shutter, and mirrors. The control device CTRL controls the operation of the image-capturing device 100, and may be formed from a semiconductor device such as an ASIC. The processing device PRCS processes signals output from the image-capturing device 100, and is a semiconductor device, such as a CPU or an ASIC, for forming an analog front end (AFE) or a digital front end (DFE). The display device DSPL is an EL display device or a liquid-crystal display device that displays information (images) obtained by the image-capturing device 100.

The memory MMRY is a magnetic device or a semiconductor device that stores information (images) obtained by the image-capturing device 100. The memory MMRY is a volatile memory such as a SRAM or DRAM, or a non-volatile memory such as a flash memory or a hard disk drive. A mechanical device MCHN includes a movable unit or propulsion unit such as a motor or an engine. The mechanical device MCHN in a camera can drive components in the optical system OPT in order to realize zooming, focusing, and shutter operations. In the equipment EQP, signals output from the image-capturing device 100 are displayed on the display device DSPL or transmitted to the outside by a communication device (not illustrated) included in the equipment EQP. Thus, the equipment EQP may further include the memory MMRY and the processing device PRCS, separately from the memory circuit units and calculation circuit units included in a control/signal processing circuit, etc., in which the image-capturing device 100 can be incorporated.

As described above, the semiconductor device pertaining to the present invention, if applied to a photoelectric conversion device, is advantageous for the improvement of the light-shielding performance of the light-shielded pixel area 2 and the improvement of the performance of the photoelectric converters in the light-receiving pixel area 1. Accordingly, the camera in which the photoelectric conversion device is incorporated can be used as a surveillance camera, an on-board camera installed in transportation equipment such as a car or a railway vehicle, etc. Here, an example in which a camera having a photoelectric conversion device incorporated therein as the semiconductor device pertaining to the present invention is applied to transportation equipment will be described with reference to FIGS. 9A and 9B.

Figure 9A:
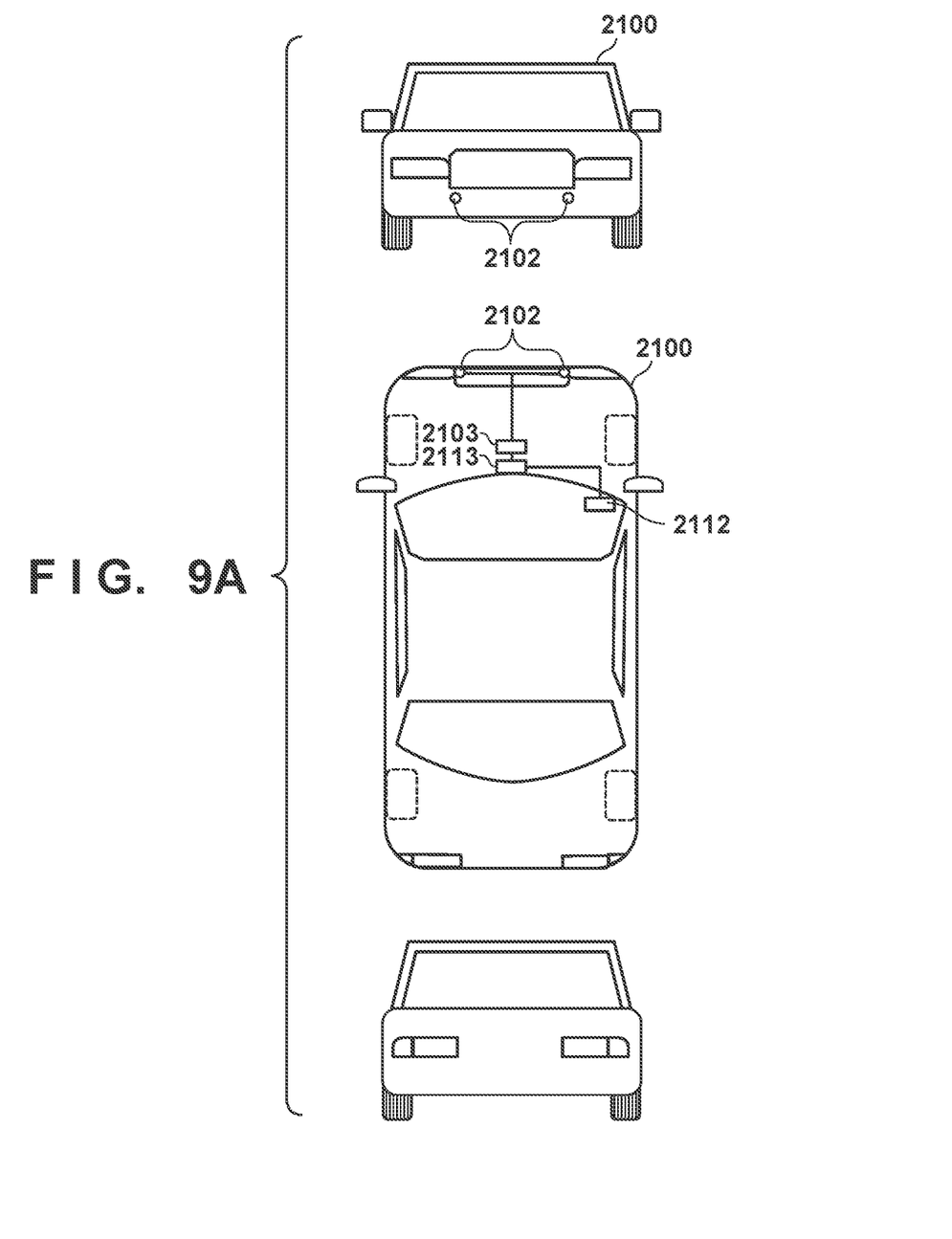
FIGS. 9A and 9B illustrate another example of equipment in which the semiconductor device is installed.
Figure 9B:
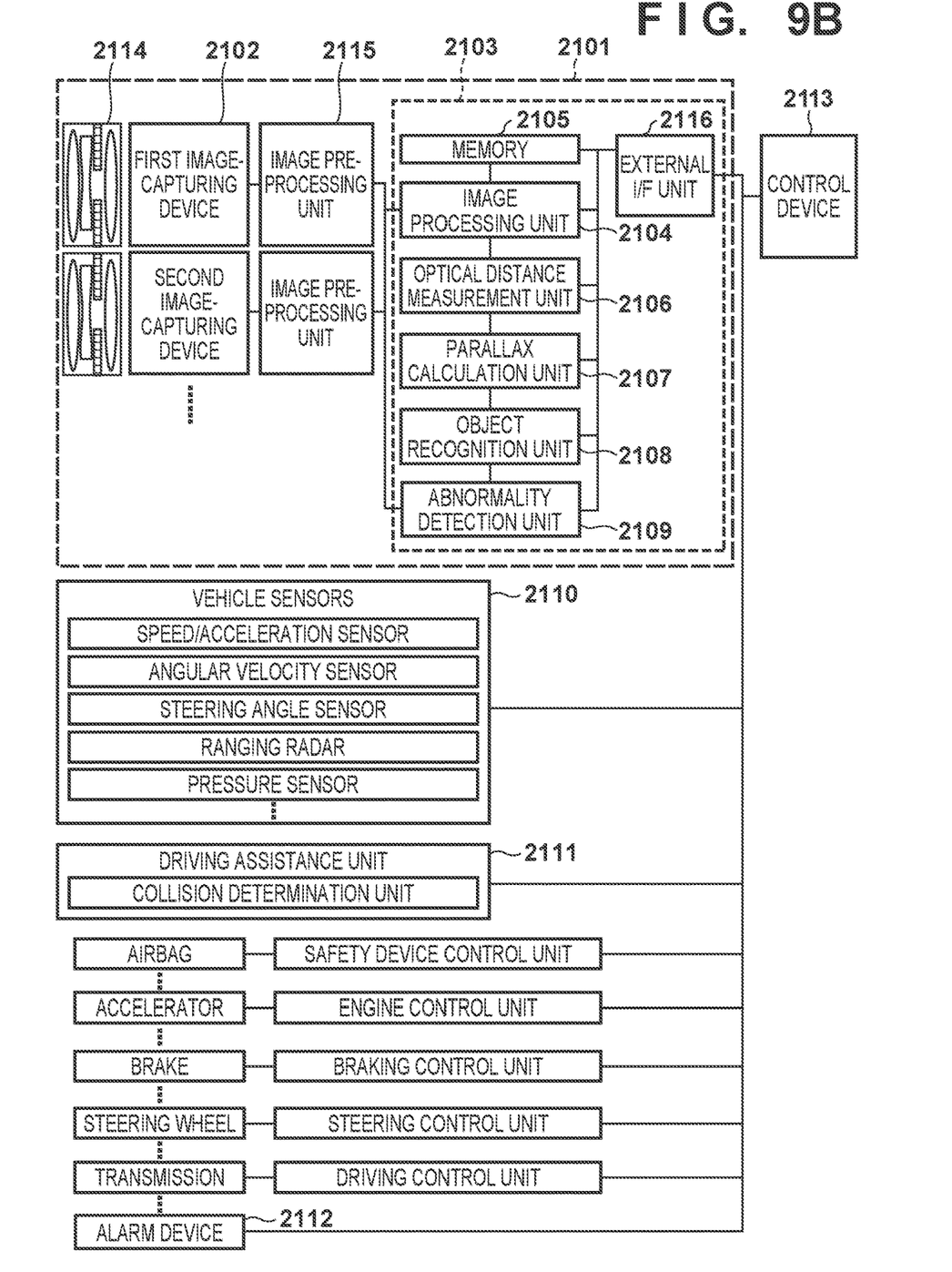

Transportation equipment 2100 may be a car including an on-board camera system 2101 as illustrated in FIGS. 9A and 9B. FIG. 9A schematically illustrates the appearance and main internal structures of the transportation equipment 2100. The transportation equipment 2100 can include image-capturing devices 2102, an image-capturing system integrated circuit (Application Specific Integrated Circuit (ASIC)) 2103, an alarm device 2112, and a main controller 2113.

Photoelectric conversion devices having the structure pertaining to the present invention are used in the image-capturing devices 2102. The alarm device 2112 alarms the driver when receiving a signal indicating an abnormality from an image-capturing system, vehicle sensors, control units, etc. The main controller 2113 performs overall control of the operations of the image-capturing system, the vehicle sensors, the control units, etc. Note that the transportation equipment 2100 need not include the main controller 2113. In such a case, a configuration may be adopted in which the image-capturing system, the vehicle sensors, and the control units individually include communication interfaces, and separately perform the transmission and reception of control signals (can comply to the CAN standard, etc.) via a communication network.

FIG. 9B is a block diagram illustrating the system configuration of the transportation equipment 2100. In the transportation equipment 2100, photoelectric conversion devices having the structure pertaining to the present invention are used in the two image-capturing devices 2102, namely a first image-capturing device and a second image-capturing device. That is, the on-board camera in the present embodiment is a stereo camera. Photographic subject images are formed in the image-capturing devices 2102 by optical units 2114. Pixel signals output from the image-capturing devices 2102 are processed by image pre-processing units 2115, and are then transmitted to the image-capturing system integrated circuit 2103. The image pre-processing units 2115 perform processing such as S/N calculation and the addition of a synchronization signal. The above-described processing device PRCS may corresponds to at least a part of the image pre-processing units 2115 and the image-capturing system integrated circuit 2103.

The image-capturing system integrated circuit 2103 includes an image processing unit 2104, a memory 2105, an optical distance measurement unit 2106, a parallax calculation unit 2107, an object recognition unit 2108, an abnormality detection unit 2109, and an external interface (I/F) unit 2116. The image processing unit 2104 generates an image signal by processing signals output from the pixels of the image-capturing devices 2102. Furthermore, the image processing unit 2104 performs the correction of the image signal and the complementation of abnormal pixels. The memory 2105 temporarily holds the image signal. Furthermore, the memory 2105 may have stored therein the known positions of abnormal pixels of the image-capturing devices 2102. The optical distance measurement unit 2106 performs focusing to a photographic subject or the measurement of the distance to a photographic subject using the image signal. The parallax calculation unit 2107 performs the collation (stereo matching) of photographic subjects in parallax images. The object recognition unit 2108 performs the recognition of photographic subjects such as transportation equipment, people, signs, and roads by analyzing the image signal. The abnormality detection unit 2109 detects the failure or malfunctioning of the image-capturing devices 2102. If a failure or malfunctioning is detected, the abnormality detection unit 2109 transmits a signal indicating that an abnormality has been detected to the main controller 2113. The external I/F unit 2116 mediates the transfer of information between the main controller 2113 or the various control units, etc., and the units in the image-capturing system integrated circuit 2103.

The transportation equipment 2100 includes a vehicle information acquisition unit 2110 and a driving assistance control unit 2111. The vehicle information acquisition unit 2110 includes vehicle sensors such as a speed/acceleration sensor, an angular velocity sensor, a steering angle sensor, a ranging radar, and a pressure sensor.

The driving assistance control unit 2111 includes a collision determination unit. The collision determination unit determines whether or not there is a possibility of collision with an object based on information from the optical distance measurement unit 2106, the parallax calculation unit 2107, and the object recognition unit 2108. The optical distance measurement unit 2106 and the parallax calculation unit 2107 are examples of distance information acquisition equipment for acquiring distance information regarding the distance to a target object. That is, the distance information is information relating to the parallax, the defocus amount, the distance to a target object, etc. The collision determination unit may determine the possibility of collision using one of such types of distance information. The distance information acquisition equipment may be realized by specifically designed hardware, or may be realized by a software module.

While a case in which the driving assistance control unit 2111 controls the transportation equipment 2100 so that the transportation equipment 2100 does not collide with another object has been described, it is possible to apply to control for automatically driving the transportation equipment 2100 so as to follow another vehicle, control for automatically driving the transportation equipment 2100 so as not to move out of a lane, etc.

The transportation equipment 2100 further includes drive devices that are used to move or assist the movement of airbags, an accelerator, a brake, a steering wheel, a transmission, an engine, a motor, wheels, propellers, etc. In addition, the transportation equipment 2100 includes control units therefor. The control units control the corresponding drive devices based on control signals from the main controller 2113.

The image-capturing system used in the present application is applicable not only to cars and railway vehicles but also to ships, airplanes, and equipment such as industrial robots. In addition, the image-capturing system is not limited to being applied to transportation equipment, and can be widely applied to equipment in which object recognition is used, such as an intelligent transport system (ITS).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2020-041217, filed Mar. 10, 2020, which is hereby incorporated by reference herein in its entirety.

What is claimed is:

1. A semiconductor device comprising:
a semiconductor layer;
a metal layer disposed above a surface of the semiconductor layer;
a first barrier portion that covers a first portion of a surface of the metal layer;
a second barrier portion that covers a second portion of the surface of the metal layer;
an insulating film that covers the metal layer and the first and second barrier portions; and
a metal member that is disposed in an opening portion provided in the insulating film, the metal member positioned on a third portion of the surface of the metal layer that is between the first portion and the second portion,
wherein the metal member is positioned between the first barrier portion and the second barrier portion, and a part of the insulating film is disposed between the metal member and the first barrier portion and between the metal member and the second barrier portion.

2. The semiconductor device according to claim 1, wherein, in the opening portion, a barrier film is disposed between the metal member and the insulating film and between the metal member and the metal layer.

3. A semiconductor device comprising:
a semiconductor layer;
a metal layer disposed above a surface of the semiconductor layer;
a first barrier portion that covers a first portion of a surface of the metal layer;
a second barrier portion that covers a second portion of the surface of the metal layer;
an insulating film that covers the metal layer and the first and second barrier portions;
a metal member that is disposed in an opening portion provided in the insulating film, the metal member positioned on a third portion of the surface of the metal layer that is between the first portion and the second portion, and
a barrier film that is disposed in the opening portion between the metal member and the insulating film and between the metal member and the metal layer,
wherein the barrier film is positioned between the first barrier portion and the second barrier portion, and a part of the insulating film is disposed between the barrier film and the first barrier portion and between the barrier film and the second barrier portion.

4. The semiconductor device according to claim 1, wherein the semiconductor layer includes light-receiving pixels and light-shielded pixels that include photoelectric converters, and
the metal layer forms a light-shielding film that blocks the entry of light to the light-shielded pixels.

5. The semiconductor device according to claim 4, wherein the metal member forms light-shielding walls that are disposed around the light-receiving pixels and the light-shielded pixels.

6. The semiconductor device according to claim 5, wherein the light-shielding walls are constituted of a plurality of tiers in a direction intersecting with a surface that the light enters.

7. The semiconductor device according to claim 4, wherein the light-receiving pixels and the light-shielded pixels are disposed in a matrix.

8. The semiconductor device according to claim 4, wherein microlenses corresponding to the photoelectric converters are disposed.

9. The semiconductor device according to claim 4, wherein gate electrodes and wiring layers are formed on the opposite side of the semiconductor layer from the metal layer forming the light-shielding film.

10. The semiconductor device according to claim 4, wherein gate electrodes and wiring layers are formed between the semiconductor layer and the metal layer forming the light-shielding film.

11. The semiconductor device according to claim 1, wherein waveguides are disposed in the insulating film.

12. The semiconductor device according to claim 1, wherein lenses are disposed in the insulating film.

13. The semiconductor device according to claim 1, wherein the metal layer includes wiring, and the metal member includes a contact plug that is connected to the wiring.

14. The semiconductor device according to claim 1, wherein the first barrier portion and the second barrier portion contain at least one of titanium, tantalum, titanium nitride, and tantalum nitride.

15. The semiconductor device according to claim 1, wherein the metal member contains tungsten, and the metal layer contains aluminum.

16. A manufacturing method for a semiconductor device, the method comprising:
    forming a metal layer above a surface of a semiconductor layer;
    forming a barrier film that covers a part of a surface of the metal layer;
    forming an opening in the barrier film;
    forming an insulating film that covers the metal layer and the barrier film;
    forming an opening portion by etching the insulating film above the opening, so that the metal layer is exposed; and
    burying a metal in the opening portion,
    wherein the forming of the opening portion is performed so that a part of the insulating film remains inside the opening.

17. The manufacturing method according to claim 16 further comprising forming, in the metal layer and the barrier film, an opening for allowing light to enter.

18. The manufacturing method according to claim 16, wherein the forming of the opening portion comprises:
    applying a photoresist pattern on the insulating film; and
    performing ashing after the etching.

19. The manufacturing method according to claim 18, wherein a fluorine-containing gas is used in the ashing.

20. Equipment comprising the semiconductor device according to claim 1,
    wherein the equipment further comprises at least one of a processing device for processing signals output from the semiconductor device and a display device for displaying information acquired by the semiconductor device.

* * * * *